US010396766B2

(12) United States Patent
Gorguddi et al.

(10) Patent No.: US 10,396,766 B2
(45) Date of Patent: Aug. 27, 2019

(54) PARASITIC CAPACITANCE CANCELLATION USING DUMMY TRANSISTORS

(71) Applicant: TEXAS INSTRUMENTS INCORPORATED, Dallas, TX (US)

(72) Inventors: Basavaraj G. Gorguddi, Bangalore (IN); Ani Xavier, Kottayam (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/854,741

(22) Filed: Dec. 26, 2017

(65) Prior Publication Data

US 2019/0199332 A1 Jun. 27, 2019

(51) Int. Cl.
| | |
|---|---|
| H03K 5/1252 | (2006.01) |
| H01L 27/02 | (2006.01) |
| H01L 23/535 | (2006.01) |
| H01L 23/528 | (2006.01) |
| H01L 27/06 | (2006.01) |
| H03M 1/12 | (2006.01) |

(52) U.S. Cl.
CPC ......... *H03K 5/1252* (2013.01); *H01L 23/528* (2013.01); *H01L 23/535* (2013.01); *H01L 27/0207* (2013.01); *H01L 27/0629* (2013.01); *H03M 1/124* (2013.01)

(58) Field of Classification Search
CPC ............. H03K 5/1252; H03K 27/0629; H03K 27/0207; H03K 23/528; H03K 23/535
See application file for complete search history.

(56) References Cited

U.S. PATENT DOCUMENTS

| | | | | |
|---|---|---|---|---|
| 4,654,823 | A * | 3/1987 | Charransol | G11C 11/4023 365/154 |
| 5,245,261 | A * | 9/1993 | Ashley | H01L 27/0248 257/467 |
| 5,317,175 | A * | 5/1994 | Throngnumchai | H01L 27/0927 257/206 |
| 7,019,679 | B2 * | 3/2006 | Mulder | H03K 17/002 341/158 |
| 7,525,173 | B2 * | 4/2009 | Yang | H01L 27/0203 257/506 |
| 8,451,046 | B2 * | 5/2013 | Oliaei | H03K 17/165 327/410 |
| 8,487,375 | B2 * | 7/2013 | Okamoto | H01L 21/76898 257/194 |
| 8,762,911 | B1 * | 6/2014 | Lu | G06F 17/5068 716/110 |
| 8,928,060 | B2 * | 1/2015 | Tsair | H01L 27/11517 257/316 |

(Continued)

*Primary Examiner* — Thomas J. Hiltunen
(74) *Attorney, Agent, or Firm* — John R. Pessetto; Charles A. Brill; Frank D. Cimino

(57) ABSTRACT

In some examples, an apparatus includes a plurality of first transistors coupled to a first input terminal and a first output terminal. The apparatus also includes a plurality of second transistors coupled to a second input terminal and a second output terminal. The apparatus further includes a plurality of first dummy transistors coupled to the first input terminal and the second output terminal. The apparatus also includes a plurality of second dummy transistors coupled to the second input terminal and the first output terminal.

16 Claims, 4 Drawing Sheets

(56) References Cited

U.S. PATENT DOCUMENTS

| | | | | |
|---|---|---|---|---|
| 8,941,439 B2* | 1/2015 | Bardsley | ............... | H03F 1/3211 |
| | | | | 330/9 |
| 9,209,790 B1* | 12/2015 | Wadhwa | .............. | H03K 5/2472 |
| 9,705,451 B2* | 7/2017 | Takenaka | .............. | H03F 1/0211 |
| 9,791,497 B2* | 10/2017 | Lu | ....................... | G01R 31/2621 |
| 10,037,814 B2* | 7/2018 | Aggrawal | ............ | G11C 27/024 |
| 2009/0102517 A1* | 4/2009 | Setterberg | .............. | G11C 27/02 |
| | | | | 327/94 |

* cited by examiner

PARASITIC CAPACITANCE CANCELLATION USING DUMMY TRANSISTORS

BACKGROUND

An analog to digital converter (ADC) circuit is often used in a wireless communication device (e.g., a base station) to convert an analog signal to a digital signal. In some cases, an ADC circuit may be used in a device that converts an input signal (e.g., voltage or current) to a digital number proportional to the magnitude of the input signal.

SUMMARY

According to an example, an apparatus includes a plurality of first transistors coupled to a first input terminal and a first output terminal. The apparatus also includes a plurality of second transistors coupled to a second input terminal and a second output terminal. The apparatus further includes a plurality of first dummy transistors coupled to the first input terminal and the second output terminal. The apparatus also includes a plurality of second dummy transistors coupled to the second input terminal and the first output terminal.

According to another example, a system includes a first switch comprising a first parasitic capacitor. The system also includes a second switch comprising a second parasitic capacitor, a first dummy switch comprising a first dummy capacitor, a second dummy switch comprising a second dummy capacitor. The system further includes a first input metal layer coupled to sources of the first switch and the first dummy switch and a second input metal layer coupled to sources of the second switch and the second dummy switch. The system also includes a first output metal layer coupled to drains of the first switch and the second dummy switch, and a second output metal layer coupled to drains of the second switch and the first dummy switch.

According to yet another example, a method includes providing a first input signal to a plurality of first transistors and generating a first output signal. The method also includes providing the first input signal to the plurality of first dummy transistors and generating a second output signal. The method also includes providing a second input signal to a plurality of second transistors and generating a third output signal. The method further includes providing the second input signal to a plurality of second dummy transistors and generating a fourth output signal. The method then includes substantially cancelling the first output signal with the fourth output signal and the second output signal with the third output signal by differentially connecting the plurality of first transistors, the plurality of second transistors, the plurality of first dummy transistors, and the plurality of second dummy transistors.

BRIEF DESCRIPTION OF THE DRAWINGS

For a detailed description of various examples, reference will now be made to the accompanying drawings in which.

DETAILED DESCRIPTION

Figure 1:
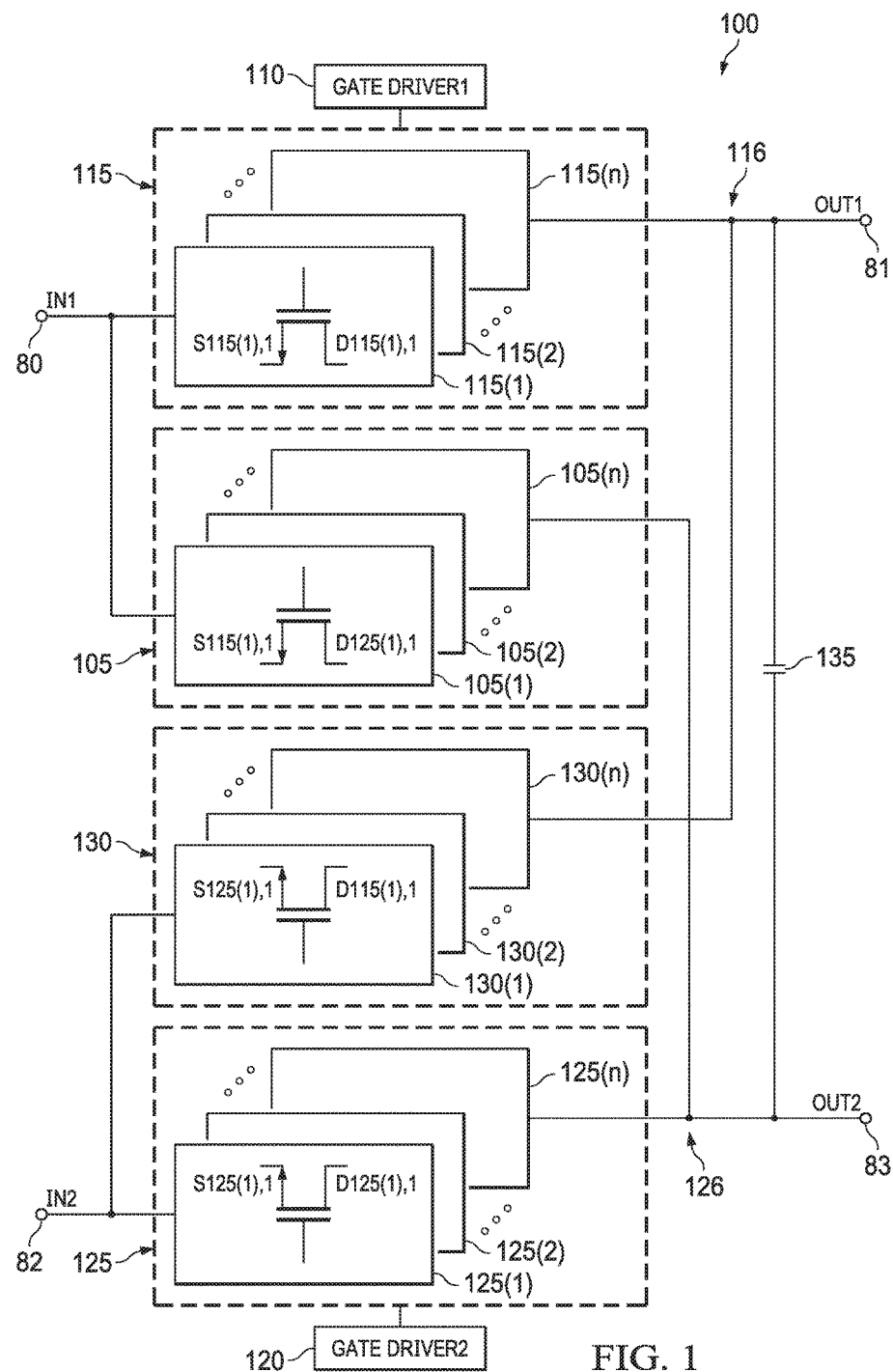
FIG. 1 is a circuit-level design of an illustrative switched-capacitor differential circuit, in accordance with various examples.

There are several techniques that an ADC circuit may employ to convert an analog signal to a digital signal. One such technique utilizes a sampling capacitor that is connected to a switch. This technique is commonly referred to as the "sampling-capacitor" or the "switched-capacitor" technique. In this technique, the switch receives an input signal that is to be converted to a digital signal. The sampling capacitor, in synchrony with the switch, samples and stores the input signal to be presented to the succeeding stages for analog to digital conversion. When the switch is turned on, it acts as a short circuit and allows the input signal to charge the capacitor to the input value to be sampled. However, when the switch is turned off, the switch performs the function of an open circuit and allows the sampling capacitor to hold the sampled value, thus performing the sampling operation.

Theoretically, an open circuit condition (i.e., when the switch is turned off) should not conduct any signal, but some imperfection in the switched-capacitor circuit may facilitate conduction of some of the input signal during the open circuit condition. In some cases, this imperfection may occur due to the switch itself. For example, a metal oxide semiconductor field effect transistor (MOSFET) is widely used as the switch in the switched-capacitor circuit. The MOSFET, due to its fabricated design structure, is prone to include some parasitic capacitance. In some cases, this parasitic capacitance may be due to the structure of the MOSFET itself. For instance, a parasitic capacitance may be introduced by the source and the drain of the MOSFET. The parasitic capacitance may cause some leakage of the input signal even when the switch is turned off (i.e., open circuit condition).

From a circuit-level design perspective, some techniques have been employed to reduce and/or eliminate the effect of parasitic capacitance in the switched-capacitor circuit. One of the techniques includes using a differential circuit that can automatically cancel out the leakage (e.g., open circuit leakage signal) caused by the parasitic capacitance. A differential circuit, in a switched-capacitor circuit, includes a two-input-two-output circuitry. These two input signals are complementary to each other, i.e., they are balanced signals that are moving at an equal phase, but at opposite amplitude. Additionally, instead of using a single MOSFET, the switched-capacitor differential circuit includes two MOSFETs. Each of the two MOSFETs receives one of the aforementioned input signals. The switched-capacitor differential circuit further generates two complementary outputs across a single sampling capacitor.

A typical differential circuit also includes one or more dummy circuit elements that relate to the source of the error. As noted above, the parasitic capacitance generated in each of the MOSFETs may be the source of error. Therefore, the switched-capacitance differential circuit approach permits including "dummy" parasitic capacitors (one for each MOSFET) that are connected to the two-input-two-output circuitry in a way that the dummy capacitors cancels out the leakage occurred due to the parasitic capacitance of each of the MOSFETs. The dummy capacitor approach works well theoretically. However, from a fabrication point of view, dummy capacitors are prone to process variations and may not produce the coupling effect needed to substantially cancel out the leakage that may occur due to the parasitic capacitance of each of the MOSFETs. Stated another way, the dummy capacitance of the dummy capacitors may vary (e.g., have a variation of 15%) from the parasitic capacitances of each of the MOSFETs, thus may result in a different leakage current, which may not be substantially cancelled.

Accordingly, at least some examples disclosed herein are directed to systems and methods for employing dummy transistors that may have dummy capacitances that maybe substantially equal (i.e., one value being within 1% of the other value) to the parasitic capacitances of each of the MOSFETs in the switched-capacitor differential circuit. Specifically, the examples are directed towards the formation of dummy transistors using a merged switch layout technique. These dummy transistors may substantially cancel the leakage that may occur due to the parasitic capacitances of the MOSFETs.

FIG. 1 is a circuit level design of an illustrative switched-capacitor differential circuit 100, which is configured to sample a first and a second input signal IN1, IN2 (respectively) across a sampling capacitor 135. FIG. 1 depicts (from a circuit level standpoint) circuit elements involved in the operation of the switched-capacitor differential circuit 100. The switched-capacitor differential circuit 100 includes a plurality of first transistors 115, a plurality of second transistors 125, a plurality of first dummy transistors 105, and a plurality of second dummy transistors 130. Due to the differential nature of the switched-capacitor differential circuit 100, the plurality of first transistors 115 is configured to receive the first input signal IN1 at an input terminal 80 and the plurality of second transistors 125 is configured to receive the second input signal IN2 at an input terminal 82. The plurality of first and second transistors 115, 125 generates two complimentary output signals OUT1 and OUT2 across a sampling capacitor 135 at output terminals 81, 83, respectively. The plurality of first dummy transistors 105 is coupled to the input terminal 80 and to the output terminal 83. The plurality of second dummy transistors 130 is coupled to the input terminal 82 and the output terminal 81. In some examples, IN1 and IN2 can be a pair of balanced signals representing an input signal. Balanced input analog signals can be signals that are moving at an equal phase, but at opposite amplitude.

The states (e.g., turned on or turned off) in which the plurality of first and second transistors 115, 125 operate may depend on the gate signals generated by gate drivers 110, 120, respectively. For example, the gate driver 110 may provide the gate signal that turns-on (short circuit) or turns-off (open circuit) the plurality of first transistors 115. Similarly, the gate driver 120 may provide the gate signal that turns-on (short circuit) or turns-off (open circuit) the plurality of second transistors 125. The gate drivers 110, 120 may generate similar gate signals at the same time, i.e., the plurality of first and second transistors 115, 125 turn on and turn off at the same time. In some examples, there are no gate drivers coupled to the plurality of dummy transistors 105, 130, i.e., the dummy transistors 105, 130 may operate in an open-circuit (off-state) condition. In some examples, the dummy transistors 105, 130 are continuously in an open-circuit condition, meaning that they are not switched on and off.

As described further in FIGS. 2(a) and 2(b) below, in some examples, a merged switch layout technique is used to form the plurality of first and second dummy transistors 105, 130. In the merged switch layout technique, each of the plurality of first dummy transistors 105 shares a source terminal with a corresponding transistor in the plurality of first transistors 115. Similarly, each of the plurality of first dummy transistors 105 shares a drain terminal with a corresponding transistor in the plurality of second transistors 125. Such sharing of transistor terminals is sometimes referred to herein as "sharing of resources" or "resource sharing." Because of this sharing of resources, charges induced in the transistor terminals due to the input signals IN1, IN2 and output signals OUT1, OUT2 are also shared. For example, charges induced by the IN1 signal received by the source terminals of the plurality of first transistors 115 are also shared by the source terminals of the plurality of dummy transistors 105. Similarly, OUT2 is generated by the drain terminals of the plurality of second transistors 125 (and, in turn, shared by the plurality of first dummy transistors 105).

In some examples, the merged switch layout technique also allows the formation of the plurality of second dummy transistors 130. The second dummy transistors 130 share some resources with other transistors (e.g., the drain terminals of the plurality of transistors 115 and the source terminal of the plurality of transistors 125). Because of the sharing of resources, the signals are also shared. For example, the OUT1 signal is generated by the drain terminals of the plurality of first transistors 115 and is also shared by the plurality of dummy transistors 130. Similarly, the IN2 signal received by the source terminals of the plurality of second transistors 125 is shared by the plurality of first dummy transistors 130.

Furthermore, in some examples, the merged switch layout technique facilitates the plurality of second dummy transistors 130 to have a structure that is substantially equal to the structure of the plurality of first transistors 115. This substantially equal structure may result in a dummy capacitance of the plurality of second dummy transistors 130 (or the sum of the dummy capacitance of each of the plurality of second dummy transistors 130) to be substantially equal to the parasitic capacitance of the plurality of first transistors 115 (or the sum of the parasitic capacitance of each of the plurality of first transistors 115). Similarly, the merged switch layout technique allows for the plurality of first dummy transistors 105 to have a structure that is substantially equal to the structure of the plurality of second transistors 125. This substantially equal structure may result in a dummy capacitance of the plurality of first dummy transistors 105 (or the sum of the dummy capacitance of each of the plurality of first dummy transistors 105) to be substantially equal to the parasitic capacitance of the plurality of second transistors 125 (or the sum of the parasitic capacitance of each of the plurality of second transistors 125).

In operation, during the off-state of the plurality of first and second transistors 115, 125 (respectively), the plurality of first transistors 115, due to the presence of the parasitic capacitance in the plurality of transistors 115, may conduct some of the first input signal IN1 (as a leakage current) and generate an OUT 1 signal. In a similar way, the plurality of second transistors 125, due to the presence of the parasitic capacitance in the plurality of transistors 125, may conduct some of the second input signal IN2 (as a leakage current) and generate an OUT 2 signal. The plurality of first dummy transistors 105 may receive the IN1 (as received by the plurality of first transistors 115). As noted above, the first dummy transistors 105, due to the similar structure (and parasitic capacitance) as of the plurality of second transistors 125, may leak an OUT2' signal at the node 126. Similarly, the plurality of second dummy transistors 130 may receive the IN2 (as received by the plurality of second transistors 125). As noted above, the second dummy transistors 130, due to the similar structure (and parasitic capacitance) as of the plurality of first transistors 115, may leak an OUT1' signal at the node 116. Due to the differential nature of the switched-capacitor differential circuit 100, the OUT1' signal may substantially cancel out the OUT1 signal and the OUT2' signal may substantially cancel out the OUT2 signal. The disclosure hereafter describes the "merged switch layout technique" from a circuit layout standpoint and fabricated design structure standpoint.

Figure 2A:
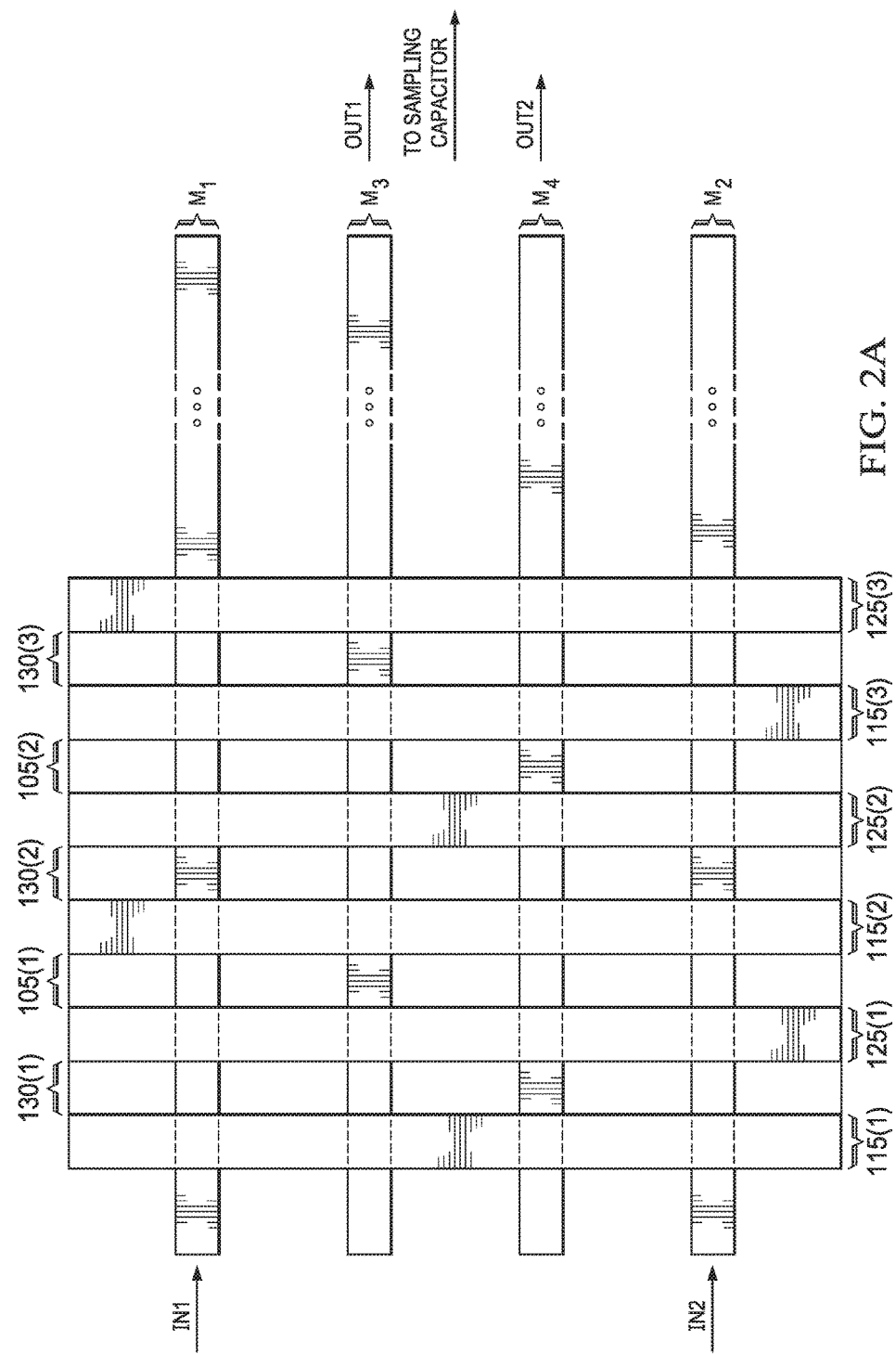
FIG. 2(a) is a layout-level design of an illustrative switched-capacitor differential circuit, in accordance with various examples.

FIG. 2(a) is a layout-level design 200 of the switched-capacitor differential circuit 100, which depicts the merged switch layout technique. The layout-level design 200 includes the plurality of first transistors 115, described above. The plurality of first transistors 115 includes multiple sets of transistors. Each such set of transistors is labeled in FIG. 2(a) using the convention 115(1), 115(2), . . . , 115(n). Together, the sets of transistors 115(1), 115(2), . . . , 115(n) constitute the plurality of first transistors 115. The circuit layout level design 200 further depicts multiple sets of the plurality of second transistors 125(1), 125(2), . . . , 125(N), where each set of the plurality of transistors includes a plurality of transistors.

Still referring to FIG. 2(a), FIG. 2(a) further depicts the plurality of first dummy transistors 105 and second dummy transistors 130. The plurality of first dummy transistors 105 includes multiple sets of transistors. Each such set of transistors is labeled in FIG. 2(a) using the convention 105(1), 105(2), . . . , 105(x). Together, the sets of transistors 105(1), 105(2), . . . , 105(x) constitute the plurality of first dummy transistors 105. The circuit layout level design 200 further depicts multiple sets of the plurality of second dummy transistors 130(1), 130(2), . . . , 130(X), where each set of the plurality of transistors includes a plurality of dummy transistors. As further described in FIG. 2(b), the dummy transistors are positioned such that a set of dummy transistors (e.g., 130(1)) may be positioned between two different sets of the plurality of transistors (e.g., 115(1) and 125(1)). The position of the set of dummy transistors may be such that it shares resources with the set of transistors adjacent to it. For example, a set of first dummy transistors 105(1) is positioned between a set of second transistors 125(1) and a set of first transistors 115(2) such that the set of first dummy transistor 105(1) share the drain terminal (not expressly shown) of the set of second dummy transistors 125(1). Further, the set of first dummy transistor 105(1) share the source terminal (not expressly shown) of the set of first dummy transistors 115(2).

The position of dummy transistors may result in sharing of resources, such that each set of the first dummy transistors 105(1), 105(2), . . . , 105(x) may receive IN1 and each set of the second dummy transistors 130(1), 130(2), . . . , 130(X) may receive IN2. The layout level design 200 further depicts the input metal layer M1 that is configured to transport the first input signal IN1 to the source terminals (not expressly shown) of the plurality of first transistors 115 (i.e., 115(1), 115(2), . . . , 115(n)). The second input metal layer M2 is configured to transport the second input signal IN2 to the source terminals (not expressly shown) of the plurality of second transistors 125 (i.e., 125(1), 125(2), . . . , 125(N)). The first output metal layer M3 is configured to receive the first output signal OUT1. OUT 1 is also received by the drain terminals (not expressly shown) of the plurality of first transistors 115. Similarly, the second output metal layer M4 is configured to receive the second output signal OUT2.

OUT2 is further received by the drain terminals (not expressly shown) of the plurality of second transistors 125.

In operation, during the off-state of the plurality of first and second transistors 115, 125 (respectively), the sets of the plurality of first transistors 115(1), 115(2) . . . 115(n), due to the presence of parasitic capacitance, may conduct some of the first input signal IN1 and generate an OUT1 signal. In a similar way, the sets of the plurality of second transistors 125(1), 125(2), . . . , 125(N), due to the parasitic capacitance, may conduct some of the second input signal 1N2. As noted above, due to shared resources, the set of plurality of first dummy transistors 105(1), 105(2), . . . , 105(x) may receive the 1N1 (as received by the plurality of first transistors 115). The first set of dummy transistors 105(1), 105(2), . . . , 105(x), further due to the similar structure (and parasitic capacitance) as of each set of the plurality of second transistors 125(1), 125(2), . . . , 125(N), may leak an OUT2' signal at the output metal layer M4.

Similarly, each set of the second dummy transistors 130(1), 130(2), . . . , 130(X) may receive 1N2 (as received by each set of the plurality of second transistors 125(1), 125(2), . . . , 125(N)). Each set of the second dummy transistors 130(1), 130(2), . . . , 130(X), due to the similar structure (and parasitic capacitance) as of each set of the plurality of first transistors 115(1), 115(2) . . . 115(n), may leak an OUT1' signal at the output metal layer M3. Due to the differential nature of the switched-capacitor differential circuit 100, the OUT1' signal may substantially cancel out the OUT1 signal and the OUT2' signal may substantially cancel out the OUT2 signal.

Figure 2B:
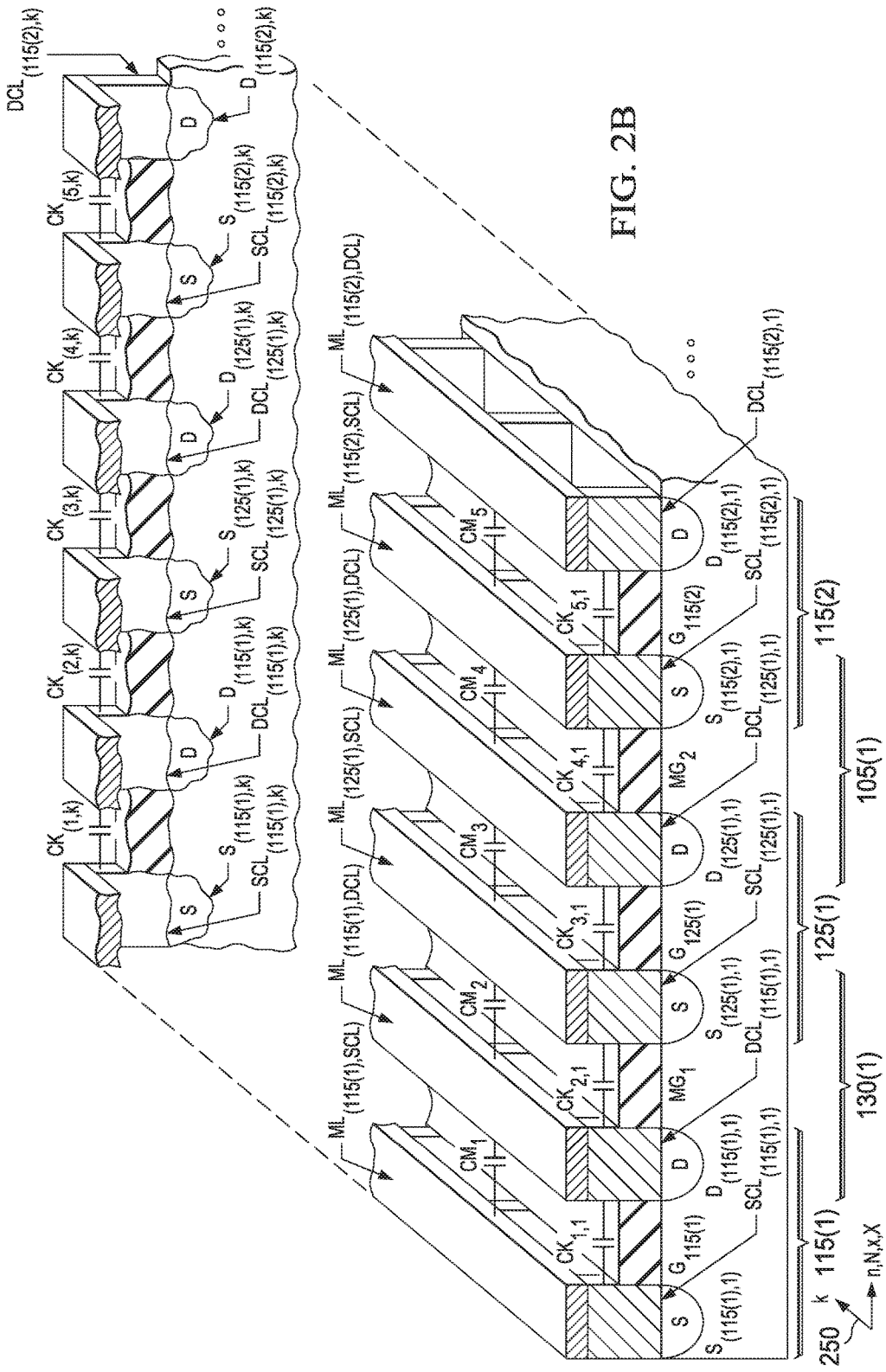
FIG. 2(b) is an illustration of the fabrication-level design of an illustrative switched-capacitor differential circuit, in accordance with various examples.

FIG. 2(b) is an illustration of the fabrication level design of FIG. 2(a). FIG. 2(b) shows, from a fabrication level perspective, each set of the plurality of first transistors 115(1), 115(2), . . . , 115(n) and second transistors 125(1), 125(2), . . . , 125(N). FIG. 2(b) depicts, using fabrication level detail, the merged switch layout technique and further illustrates the cancellation of the parasitic capacitance from a fabrication level perspective. FIG. 2(b) also depicts a legend 250 that further depicts the direction in which "k" number of source regions, drain regions, source contact layers and drain contact layers that are present. Additionally, the legend 250 further depicts the direction in which "n" numbers of the plurality of first transistors and "N" number of the plurality of second transistors are present. The legend 250 also depicts the direction in which "x" numbers of the plurality of first dummy transistors, "X" number of the plurality of second dummy transistors, and "Y" number of merged gate layers are present.

FIG. 2(b) depicts set of the plurality of first transistors 115(1), 115(2), . . . , 115(n), each of which includes a plurality of source regions. For instance, the source regions of the set of plurality of transistors 115(1) includes S(115(1),1), S(115(1),2), . . . , S(115(1),k)), and the source regions of the set of plurality of transistors 115(2) includes S(115(2),1), S(115(2),2), . . . , S(115(2),k)). Similarly, the source regions of the nth set of plurality of transistors 115(n) includes S(115(n),1), S(115(n),2), . . . , S(115(n),k)). In some examples, the plurality of source regions may include as a structure of the set of plurality of first transistors 115(1), 115(2), . . . , 115(n). FIG. 2(b) also depicts the plurality of drain regions of each of the set of the plurality of first transistors. For instance, the drain regions of the first set of plurality of transistors 115(1) includes D(115(1),1), D(115(1),2), . . . , D(115(1),k)), and the drain regions of the second set of plurality of transistors 115(2) includes D(115(2),1), D(115(2),2), . . . , D(115(2),k)). Similarly, the drain regions of the nth set of plurality of transistors 115(n) includes D(115(*n*),1), D(115(*n*),2), . . . , D(115(*n*),*k*)). In some examples, the plurality of drain regions may include as a structure of the first transistors 115(1), 115(2), . . . , 115(*n*). FIG. 2(*b*) further depicts gate regions of the multiple sets of the plurality of first transistors—for instance, G(115(1)), G(115(2)), . . . , G(115(*n*)). In some examples, the multiple sets of gate regions may include as a structure of the first transistors 115(1), 115(2), . . . , 115(*n*).

FIG. 2(*b*) also depicts separate drain contact layers that are coupled to each of the drain regions of 115(1), 115(2), . . . , 115(*n*). In some examples, these drain contact layers may be included as the structure of the transistors 115(1), 115(2), . . . , 115(*n*). For instance, the drain regions of the first set 115(1) are coupled to their respective drain contact layers DCL(115(1),1), DCL(115(1),2), . . . , DCL(115(1),*k*)), and the drain regions of the second set 115(2) are coupled to their respective drain contact layers DCL(115(2),1), DCL(115(2),2), . . . , DCL(115(2),*k*)). Similarly, the drain regions of the nth set 115(*n*) are coupled to their respective drain contact layers DCL(115(*n*),1), DCL(115(*n*),2), . . . , DCL(115(*n*),*k*)). FIG. 2(*b*) also depicts the source contact layers that are coupled to each of the source regions of 115(1), 115(*n*), . . . , 115(*n*). In some examples, these source contact layers may be included as the structure of the transistors 115(1), 115(2), . . . , 115(*n*) For instance, the source regions of the first set 115(1) are coupled to their respective source contact layers SCL(115(1),1), SCL(115(1),2), . . . , SCL(115(1),*k*)), and the source contact layers of the second set 115(2) includes SCL(115(2),1), SCL(115(2),2), . . . , SCL(115(2),*k*)). Similarly, the source contact layers of the nth 115(*n*) set includes SCL(115(*n*),1), SCL(115(*n*),2), . . . , SCL(115(*n*),*k*)).

All the source contact layers in a set of transistors (e.g., 115(1)) couple to the same source metal layer—for instance, ML(115(1), SCL). Similarly, ML(115(2),SCL) connects to the source contact layers in the second set of transistors 115(2) and ML(115(*n*), SCL) connects to the source contact layers in the nth set of transistors 115(*n*). Further, the drain contact layers in a set of transistors (e.g., 115(1)) couple to the same drain metal layer—for instance, ML(115(1), DCL) connects to the drain contact layers of the first set of plurality of transistors. Similarly, ML(115(2), DCL) connects to the drain contact layers in the second set of plurality of transistors 115(2), and ML(115(*n*), DCL) connects to the drain contact layers in the nth set of transistors 115(*n*). In some examples, these metal layers may be included as the structure of the transistors 115(1), 115(2), . . . , 115(*n*).

Similar to the aforementioned discussion, FIG. 2(*b*) further depicts multiple sets of the plurality of second transistors 125(1), 125(2), . . . , 125(N), which includes a plurality of source regions of each set of the plurality of second transistors—for instance, the source regions of the first set 125(1) that includes S(125(1),1), S(125(1),2), . . . , S(125(1),*k*)), and the source regions of the second set 125(2) that includes S(125(2),1), S(125(2),2), . . . , S(125(2),*k*)). Similarly, the source regions of the Nth set 125(N) includes S(125(N),1), S(125(N),2), . . . , S(125(N),k)). FIG. 2(*b*) also includes the plurality of drain regions of each of the set of the first transistors. For instance, the drain regions of the first set of plurality of transistors 125(1) includes D(125(1),1), D(125(1),2), . . . , D(125(1),*k*)), and the drain regions of the second set 125(2) includes D(125(2),1), D(125(2),2), . . . , D(125(2),*k*)), and the drain regions of the Nth set 125(N) includes D(125(N),1), D(125(N),2), . . . , D(125(N),k)). FIG. 2(*b*) further depicts gate regions of all the sets of the plurality of second transistors—for instance, G(125(1)) is the gate region of the first set of plurality of transistors 125(1), G(125(2)) is the gate region of the second set of plurality of transistors 125(2), . . . , G(125(N)) is the gate region of the Nth set of plurality of transistors 125(N).

FIG. 2(*b*) also depicts separate drain contact layers that are coupled to each of the drain regions of 125(1), 125(*n*), . . . , 125(N)—for instance, the drain regions of the first set 115(1) are coupled to their respective drain contact layer DCL(125(1),1), DCL(125(1),2), . . . , DCL(125(1),*k*)), and the drain contact layers of the second set 125(2) are coupled to their respective drain contact layer DCL(125(2),1), DCL(125(2),2), . . . , DCL(125(2),*k*)). Similarly, the drain contact layers of the Nth 125(N) are coupled to their respective drain contact layer DCL(125(N),1), DCL(125(N),2), . . . , DCL(125(N),k)). FIG. 2(*b*) also depicts the source contact layers that are coupled to each of the source regions of 125(1), 125(N), . . . , 125(N). For instance, the source regions of the first set 125(1) are coupled to their respective source contact layer SCL(125(1),1), SCL(125(1),2), . . . , SCL(125(1),*k*)), and the source contact layers of the second set 125(2) are coupled to their respective source contact layer SCL(125(2),1), SCL(125(2),2) . . . , SCL(125(2),*k*)), and the source contact layers of the Nth 125(N) set are coupled to their respective source contact layer SCL(125(N),1), SCL(125(N),2), . . . , SCL(125(N),k)).

FIG. 2(*b*) also depicts metals layers coupled to all the multiple sets of second transistors 125(1), 125(2), . . . , 125(N). All the source contact layers in a set of transistors (e.g., 125(1)) couple to the same source metal layer—for instance, ML(125(1), SCL). Similarly, ML(125(2),SCL) connects to all the source contact layers in the second set of transistors 125(2), and ML(125(N), SCL) connects to all the source contact layers in the Nth set of transistors 125(N). Further, all the drain contact layers in a set of transistors (e.g., 125(1)) couple to the same drain metal layer—for instance, ML(125(1), DCL). Similarly, ML(125(2), DCL) connects to all the drain contact layers in the second set of transistors 125(2) and ML(125(N), DCL) connects to all the drain contact layers in the nth set of transistors 125(N). In some examples, the source regions, the drain regions, the gate regions, the source contact layers, the drain contact layers, the metal layers may include as the structure of the transistors 125(1), 125(2), . . . , 125(N).

FIG. 2(*b*) further depicts a gate layer MG1 merged between the first set of the plurality of first transistors 115(1) and the first set of the plurality of second transistors 125(1). Merging the gate layer MG1 results in the formation of the first set of the plurality of second dummy transistors 130(1). As noted above in FIG. 2(*a*), the gate layer MG1 is merged such that it shares some of the resources of the plurality of transistors on either side of MG1. For example, the first set of plurality of second dummy transistors 130(1) shares the source regions of the first set of plurality of second transistors 125(1),e.g., S(125(1),1), . . . , S(125(1),*k*)). The first set of plurality of second dummy transistors 130(1) also share the source contact layers (SCL(125(1),1), . . . , SCL(125(1), k), and the source metal layer metal layer ML(125(1), SCL)). The first set of plurality of second dummy transistors 130(1) further shares the drains of the first set of plurality of first transistors 115(1) (e.g., D(115(1),1, . . . , D(115(1), k)), the drain contact layers (DCL(115(1),1), . . . , DCL(115(1), k) and the drain metal layer ML(115(1),DCL)). In some examples, the structure of the merged gate MG1 is substantially similar to the structure of the gate layer G115(1). In some examples, this substantially similar structure may result in a substantially similar structure of the first set of the plurality of dummy transistors 130(1) to be similar to the first set of the plurality of the first transistors 115(1). This principle may be extended for the multiple sets of the plurality of first transistors 115(1), . . . 115(n) and the multiple sets of the plurality of second dummy transistors 130(1), . . . 130(X).

Similarly, FIG. 2(b) depicts another gate layer MG2 that is merged between the first set of the plurality of second transistors 125(1) and the second set of the plurality of first transistors 115(2). Merging the gate layer MG2 results in the formation of the first set of the plurality of second dummy transistors 105(1). The gate layer MG2 is also merged such that it shares some of the resources of the plurality of transistors on either side of MG2. For example, the plurality of dummy transistors 105(1) shares the source regions of the second set of plurality of first transistors 115(2), e.g., S(115(2),1), . . . , S(115(2),k), the source contact layers (SCL(115(2),1), . . . , SCL(125(2), k), and the source metal layer ML(115(2), SCL). The plurality of dummy transistors 105(1) further shares the drains of the first set of plurality of second transistors 125(1), e.g., D(125(1),1), . . . , S(125(1), k), the source contact layers (DCL(125(1),1), . . . , DCL(125(1), k), and the metal layer ML(125(1), DCL)). In some examples, this substantially similar structure may result in a substantially similar structure of the first set of the plurality of first dummy transistors 105(1) to be similar to the first set of the plurality of the second transistors 125(1). This principle may be extended for the sets of the plurality of second transistors 125(1), . . . 125(N) and the sets of the plurality of first dummy transistors 105(1), . . . 105(x).

FIG. 2(b) further depicts the parasitic capacitance that may be present in the set of plurality of first transistors 115(1), 115(2), . . . , 115(n) and each set of plurality of second transistors 125(1), 125(2), . . . , 125(n). For example, for the case of the first set of plurality of transistors 115(1), the drain contact layer DCL(115(1),1) and the source contact layer SCL(115(1),1) form a contact layer capacitor that generates a contact layer parasitic capacitance CK1,1. Similarly, each of the plurality of source and drain contact layers present in the first set of plurality of transistors 115(1) generates contact layer capacitance. Furthermore, the source metal layers ML(115(1),SCL) and ML(115(1),DCL) form an additional capacitor that generates a metal layer capacitance CM1.

Similarly, the first set of plurality of dummy transistors 130(1) may include a contact layer capacitance for the contact layers in 130(1), i.e., CK2,1, CK2,2, CK2,3 . . . , CK2,k. The source metal layers ML(115(1),SCL) and ML(125(1),DCL) may include a metal layer capacitance of CM3. Similar to the discussion above, the contact capacitance and the metal layer capacitance between the metal layers may be present between the other sets of plurality of first dummy transistors 105(1), 105(2), 105(3), . . . , 105(x). The first parasitic capacitance may be the sum of all the contact layer capacitance and the metal layer capacitance in the set of plurality of first transistors 115(1), 115(2), . . . , 115(n). The second parasitic capacitance may be the sum of all the contact layer capacitance and the metal layer capacitance in the set of plurality of second transistors 125(1), 125(2), . . . , 125(N), The first dummy capacitance may be the sum of all the contact layer capacitance and the metal layer capacitance in the set of plurality of first dummy transistors 105(1), 105(2), . . . , 105(x), The second dummy capacitance may be the sum of all the contact layer capacitance and the metal layer capacitance in the set of plurality of second transistors 130(1), 130(2), . . . , 130(X). In some examples, due to the similar structure, the first dummy capacitance may be substantially equal to the second parasitic capacitance, and the second dummy capacitance may be substantially equal to the first parasitic capacitance.

Referring simultaneously to FIGS. 2(a) and 2(b), in operation, during the off-state, each source region of the set of plurality of first transistors 115(1), 115(2), . . . , 115(n), due to the presence of parasitic capacitance, may conduct some of the first input signal IN1 (leakage current) through M1, because M1 couples to the source metal layer ML(115(1), SCL), ML(115(2), SCL), . . . , ML(115(n), SCL), which further couples to the source contact layers SCL(115(1),1), . . . , SCL(115(1), k), . . . , SCL(115(n), 1), . . . , SCL(115(n), k). The source contact layers further connect to each of the respective source regions S(115(1),1), . . . , S(115(1),k), . . . , S(115(n),1), . . . , S(115(n), k) which forms the electrical route for the source regions to receive the first input signal IN1. Similarly, each source region of the set of plurality of second transistors 125(1), 125(2), . . . , 125(N), due to the presence of parasitic capacitance, may conduct some of the second input signal IN2 (leakage current) through M2, because M2 couples to the source metal layer ML(125(1), SCL), ML(125(2), SCL), . . . , ML(125(N), SCL), which further couples to the source contact layers SCL(125(1),1), . . . , SCL(125(1), k), . . . , SCL(125(N), 1), . . . , SCL(125(N), k). The source contact layers further connect to each of the respective source regions S(125(1),1), . . . , S(125(1),k), . . . , S(125(N),1), . . . , S(125(N), k) which form the electrical route for the source regions to receive the second input signal IN2.

As noted above, the outputs OUT1 and OUT 2 may be generated across the sampling capacitor 135. The set of plurality of first dummy transistors 105(1), 105(2), . . . , 105(x), due to the shared resources and a similar structure as the set of plurality of second transistors 125(1), 125(2), . . . , 125(N), receives IN1. Due to its parasitic capacitance, the set of plurality of first dummy transistors 105(1), 105(2), . . . , 105(x) generates an OUT2' signal at M4. Similarly, the set of plurality of first transistors 130(1), 130(2), . . . , 130(X), due to the shared resources and a similar structure as the set of plurality of first transistors 115(1), 115(2), . . . , 115(n), receives IN2. Due to its parasitic capacitance, the set of plurality of first transistors 115(1), 115(2), . . . , 115(n) generate OUT1'. Due to the differential nature of the, the OUT1' signal may substantially cancel out the OUT1 signal and the OUT2' signal may substantially cancel out the OUT2 signal.

Figure 3:
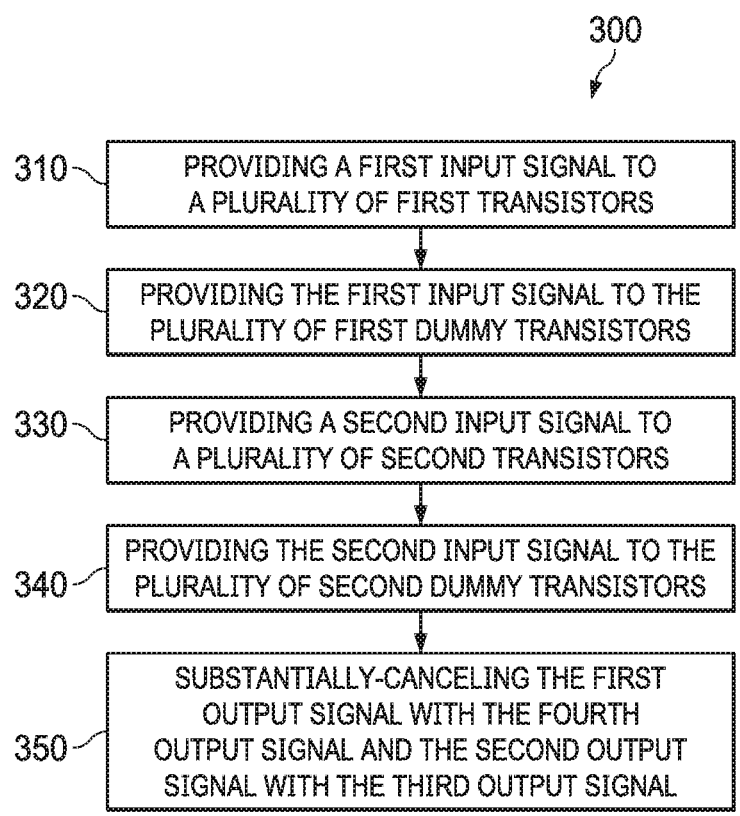
FIG. 3 is a flow diagram of an illustrative method for canceling a parasitic capacitance, in accordance with various examples.

FIG. 3 is a flow diagram of an illustrated method 300. The method 300 describes an illustrative operation performed by the switched-capacitor differential circuit 100. Therefore, the method 300 is described in tandem with the FIG. 1. Method 300 begins, during off-state, due to the parasitic capacitance, providing the first input signal IN1 (as leakage signal) to a plurality of first transistors 115 (step 310) that generates the first output signal. The method 300 further includes providing the first input signal IN1 (as leakage signal) to a plurality of first dummy transistors 105 (step 320) that generates the second output signal. The method 300 further includes providing a second input signal IN2 (as leakage signal) to the plurality of second transistors 125 (step 330) that generates the third output signal. Further, the method 300 includes providing the second input analog signal IN2 (as leakage signal) to the plurality of second dummy transistors 130 (step 340) that generates the fourth output signal. The method 300 further includes substantially cancelling, due to the differential connection of the switched-capacitance differential circuit 100, the first output signal with the fourth output signal and the second output signal with the third output signal (step 350). The same process may be performed any number of times, depending on the number of sets of transistors in the switched-capacitor differential circuit 100. The method 300 may be modified as desired and as appropriate, including by adding, deleting, modifying, or rearranging one or more steps.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. An apparatus, comprising:
    a plurality of first transistors coupled to a first input terminal and a first output terminal;
    a plurality of second transistors coupled to a second input terminal and a second output terminal;
    a plurality of first dummy transistors coupled to the first input terminal and the second output terminal; and
    a plurality of second dummy transistors coupled to the second input terminal and the first output terminal;
    wherein the plurality of first transistors share a first interdigitated n-type doped region with the plurality of first dummy transistors;
    wherein the plurality of first transistors share a second interdigitated n-type doped region with the plurality of second dummy transistors;
    wherein the plurality of second transistors share a third interdigitated n-type doped region with the plurality of second dummy transistors; and
    wherein the plurality of second transistors share a fourth interdigitated n-type doped region with the plurality of first dummy transistors.

2. The apparatus of claim 1, wherein the first output terminal and the second output terminal are connected to a sampling capacitor that is configured to generate a sampled output signal of an input signal received at the first input terminal and the second input terminal.

3. The apparatus of claim 1, wherein each of the plurality of first dummy transistors and each of the plurality of second dummy transistors is configured to remain in an off-state.

4. The apparatus of claim 1, wherein a structure of each of the plurality of first transistors is substantially similar to a structure of the each of the plurality of second dummy transistors, wherein a structure of each of the plurality of second transistors is substantially similar to a structure of the each of the plurality of first dummy transistors.

5. The apparatus of claim 1, wherein the plurality of first transistors comprises a first parasitic capacitance, the plurality of second transistors comprises a second parasitic capacitance, the plurality of first dummy transistors comprises a first dummy capacitance, the plurality of second dummy transistors comprises a second dummy capacitance, wherein the first parasitic capacitance is substantially equal to the second dummy capacitance, and the second parasitic capacitance is substantially equal to the first dummy capacitance.

6. The apparatus of claim 5, wherein the first parasitic capacitance is configured to generate a first output at the first terminal, the second dummy capacitance is configured to generate a second output at the first output terminal, the second parasitic capacitance is configured to generate a third output at the second output terminal, the first dummy capacitance is configured to generate a fourth output at the second output, wherein the first output substantially cancels the second output and the third output substantially cancel the fourth output.

7. The apparatus of claim 5, wherein the first parasitic capacitance is the sum of a parasitic capacitance of each of the plurality of first transistors, wherein the second parasitic capacitance is the sum of a parasitic capacitance of each of the plurality of second transistors, wherein the first dummy capacitance is the sum of a parasitic capacitance generated by each of the plurality of first dummy transistors, and wherein the second dummy capacitance is the sum of a parasitic capacitance generated by each of the plurality of second dummy transistors.

8. The apparatus of claim 1, wherein the first input terminal and the second input terminal is configured to receive a balanced signal.

9. A system comprising:
    a first switch comprising a first parasitic capacitor;
    a second switch comprising a second parasitic capacitor;
    a first dummy switch comprising a first dummy capacitor;
    a second dummy switch comprising a second dummy capacitor,
    a first input metal layer coupled to sources of the first switch and the first dummy switch;
    a second input metal layer coupled to sources of the second switch and the second dummy switch;
    a first output metal layer coupled to drains of the first switch and the second dummy switch; and
    a second output metal layer coupled to drains of the second switch and the first dummy switch;
    wherein the sources of the first switch and the first dummy switch share a first interdigitated n-type doped region;
    wherein the sources of the second switch and the second dummy switch share a second interdigitated n-type doped region;
    wherein the drains of the first switch and the second dummy switch share a third interdigitated n-type doped region; and
    wherein the drains of the second switch and the first dummy switch share a fourth interdigitated n-type doped region.

10. The system of claim 9, wherein the first input metal layer and the second input metal layer is configured to receive a balanced input signal.

11. The system of claim 9, wherein:
    the first switch is configured to generate a first output at the first output metal layer, the second switch is configured to generate a second output at the second output metal layer, the first dummy switch is configured to generate a third output at the second output metal layer, and the second dummy switch is configured to generate a fourth output at the first output metal layer, wherein the fourth output is configured to substantially cancel the first output at the second metal layer, the second output is configured to substantially cancel the third output at the first metal layer.

12. The system of claim 11, wherein:
    the first output depends on the a first parasitic capacitance configured to be generated by the first parasitic capacitor;
    the second output depends on a second parasitic capacitance configured to be generated by the second parasitic capacitor;
    the third output depends on a first dummy capacitance configured to be generated by the first dummy capacitor; and
    the fourth output depends on a second dummy capacitance configured to be generated by the second dummy capacitor.

13. The system of claim 9, wherein the second dummy switch is formed by sharing a first resource with the first switch and a second resource with the second switch, wherein the first dummy switch is formed by sharing a third resource of the second switch and a fourth resource of a fifth switch.

14. The system of claim 13, wherein:
the first resource comprises a first drain contact layer and a first drain metal layer;
the second resource comprises a first source contact layer and a first source metal layer;
the third resource comprises a second drain contact layer and a second drain metal layer coupled; and
the fourth resource comprises a second source contact layer and a second source metal layer.

15. The system of claim 14, wherein:
the first dummy capacitance is the capacitance between:
the first drain metal layer and the first source metal layer; and
the first drain contact layer and the first source contact layer;
the second dummy capacitance is the capacitance between:
the second drain metal layer and the second source metal layer; and
the second drain contact layer and the second source contact layer.

16. The system of claim 9, wherein the first output metal layer and the second output metal layer is connected to a sampling capacitor that is configured to generate a sampled output signal of the first input signal and the second input signal.

* * * * *